(12) United States Patent
Podzemny

(10) Patent No.: US 9,831,858 B2
(45) Date of Patent: Nov. 28, 2017

(54) RING OSCILLATOR WITH OPPOSED VOLTAGE RAMPS AND LATCH STATE

(71) Applicant: SEMICONDUCTOR COMPONENTS INDUSTRIES, LLC, Phoenix, AZ (US)

(72) Inventor: Martin Podzemny, Valasske Mezirici (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/155,956

(22) Filed: May 16, 2016

(65) Prior Publication Data

US 2017/0207778 A1     Jul. 20, 2017

Related U.S. Application Data

(60) Provisional application No. 62/279,120, filed on Jan. 15, 2016.

(51) Int. Cl.
| | |
|---|---|
| *H03K 5/135* | (2006.01) |
| *H03K 19/21* | (2006.01) |
| *H03K 19/00* | (2006.01) |
| *H03K 5/24* | (2006.01) |
| *H03K 19/003* | (2006.01) |

(52) U.S. Cl.
CPC ............... *H03K 5/135* (2013.01); *H03K 5/24* (2013.01); *H03K 19/0016* (2013.01); *H03K 19/00384* (2013.01); *H03K 19/21* (2013.01)

(58) Field of Classification Search
CPC ........ H03K 5/003; H03K 3/012; H03K 3/013; H03K 3/0231; H03K 5/1536; H03K 5/1565; H03K 7/08
USPC .......................... 327/103, 291, 294, 298, 299
See application file for complete search history.

(56) References Cited

U.S. PATENT DOCUMENTS

| | | | |
|---|---|---|---|
| 4,465,983 A | 8/1984 | Hogeboom | |
| 4,904,960 A | 2/1990 | Izadinia et al. | |
| 2005/0134354 A1* | 6/2005 | Friedrich | H03K 3/0231 |
| | | | 327/299 |
| 2008/0238518 A1* | 10/2008 | Guo | H03K 3/011 |
| | | | 327/292 |
| 2013/0038364 A1* | 2/2013 | Tokairin | H03K 4/502 |
| | | | 327/156 |

* cited by examiner

*Primary Examiner* — John Poos
(74) *Attorney, Agent, or Firm* — Patent Law Group: Atkins and Associates, P.C.

(57) ABSTRACT

A clock generator comprises a first capacitor, a current source, and a voltage node. A first switch is coupled between the first capacitor and the current source. A second switch is coupled between the first capacitor and voltage node.

18 Claims, 8 Drawing Sheets

RING OSCILLATOR WITH OPPOSED VOLTAGE RAMPS AND LATCH STATE

CROSS-REFERENCE TO RELATED APPLICATION

This application claims priority to U.S. Provisional Application No. 62/279,120, filed on Jan. 15, 2016, entitled "RING OSCILLATOR WITH OPPOSED VOLTAGE RAMPS AND LATCH STATE," invented by Martin PODZEMNY, and is incorporated herein by reference and priority thereto for common subject matter is hereby claimed.

BACKGROUND

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

FIG. 1 illustrates electronic device 50 having a chip carrier substrate or printed circuit board (PCB) 52 with a plurality of semiconductor packages mounted on a surface of the PCB. Electronic device 50 can have one type of semiconductor package, or multiple types of semiconductor packages, depending on the application. Different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Electronic device 50 can also be a graphics card, network interface card, or other expansion card that is inserted into a personal computer. The semiconductor packages can include microprocessors, memories, application specific integrated circuits (ASIC), programmable logic circuits, analog circuits, radio frequency (RF) circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages. A clock signal is transmitted between semiconductor packages via traces 54.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

A manufacturer of electronic device 50 provides a clock signal to each semiconductor package to operate the synchronous logic elements within each package. Digital circuits of the semiconductor packages include flip-flops or latches which operate on edges of the clock signal. A binary digital value is either a logic zero or a logic one. A clock signal rapidly fluctuates between a logic zero and logic one. When a clock signal transitions from a logic zero to a logic one, the transition is a rising edge of the clock signal. When a clock signal transitions from a logic one to a logic zero, the transition is a falling edge of the clock signal. A logic one is commonly a $V_{DD}$ voltage or other voltage node used to power the electronic device. A logic zero is commonly a ground voltage node or zero volts.

In many embodiments of electronic device 50, the electronic device is able to enter a low-power sleep state. While electronic device 50 is in a low-power state, the clock signal is still used for certain functions, including to allow the electronic device to wake up from the sleep state. Therefore, electronic component manufactures desire to reduce the power consumption of clock generation circuitry. Reducing the power consumption of a clock that runs while an electronic device is sleeping increases the amount of time that a battery powering the device lasts between battery charges.

In addition, many electronic devices 50 are used in situations where the ambient temperature can vary widely. Manufacturers of electronic products desire clock signal generation circuitry that does not vary significantly as a function of temperature.

SUMMARY

A need exists for an adjustable clock generation circuit with low power consumption and low temperature dependence. Accordingly, in one embodiment, the present disclosure is a clock generator comprising a first capacitor, a current source, and a voltage node. A first switch is coupled between the first capacitor and the current source. A second switch is coupled between the first capacitor and the voltage node.

In another embodiment, the present disclosure is a clock generation circuit comprising a first capacitor and a current source. A first switch is coupled between the first capacitor and the current source. A first comparator includes a first input of the first comparator coupled to the first capacitor and an output of the first comparator coupled to a control terminal of the first switch.

In another embodiment, the present disclosure is a method of generating a clock signal comprising the steps of providing a first capacitor including a first voltage potential on the first capacitor, providing a comparator including a first input coupled to receive the first voltage potential, coupling the first capacitor to a first current source, and coupling the first capacitor to a voltage node after a change of an output of the comparator.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure.

Figure 1:
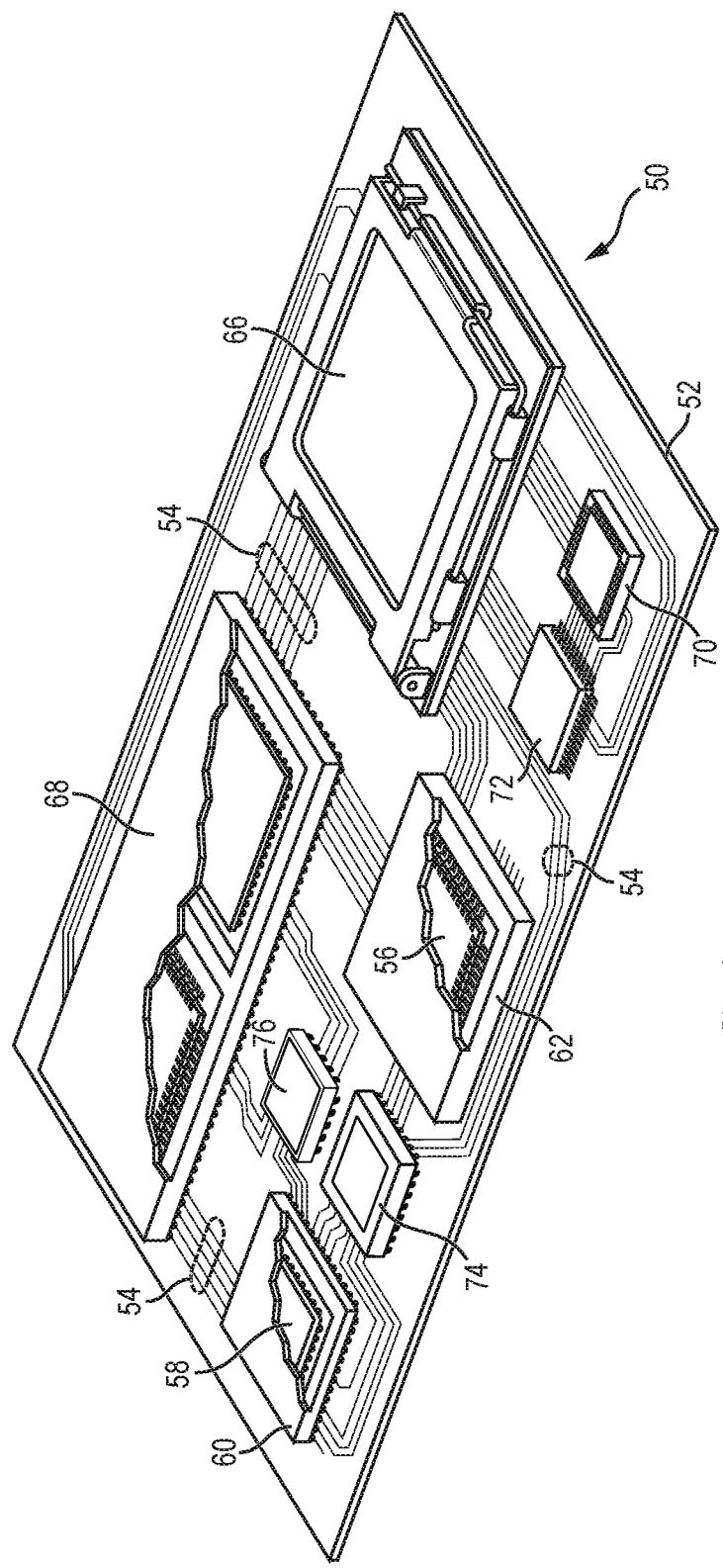
FIG. 1 illustrates an electronic device that uses a clock signal.
Figure 2A:
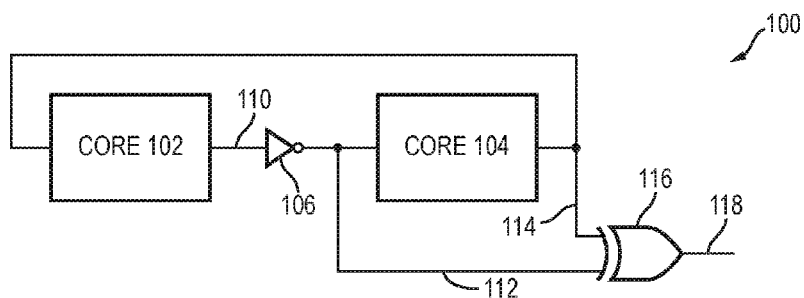
FIGS. 2a-2b illustrate a clock generation block.

FIG. 2a illustrates a topological block diagram of a clock generation block 100 usable with electronic device 50, and other electronic or semiconductor devices. Clock generation block 100 includes clock generation core 102 and clock generation core 104 coupled in a loop or ring topology. An inverter 106 is coupled in series between clock generation core 102 and clock generation core 104. Clock generation core 102 outputs a clock signal 110 to inverter 106. Inverter 106 outputs a clock signal 112 which is the logical inverse of clock signal 110. That is, when clock signal 110 is output as a logic one by clock generation core 102, inverter 106 drives clock signal 112 as a logic zero. When clock signal 110 is output as a logic zero, inverter 106 outputs clock signal 112 as a logic one.

Clock generation core 104 receives clock signal 112 from inverter 106 and outputs a clock signal 114. Clock signal 114 operates at approximately the same frequency as clock signals 110 and 112, but is at a phase offset approximately 90 degrees from clock signals 110 and 112. Clock signal 114 is routed as an input to clock generation core 102 to complete the ring. An XOR gate 116 receives both clock signals 112 and 114 as inputs, and outputs a clock signal 118 which oscillates at approximately twice the frequency of clock signals 110, 112, and 114 due to clock signal 114 being offset 90 degrees from clock signal 112. An XOR gate outputs a logic one value if exactly one of two inputs is a logic one. An XOR gate outputs a logic zero if both inputs are logic zero or logic one.

Figure 2B:
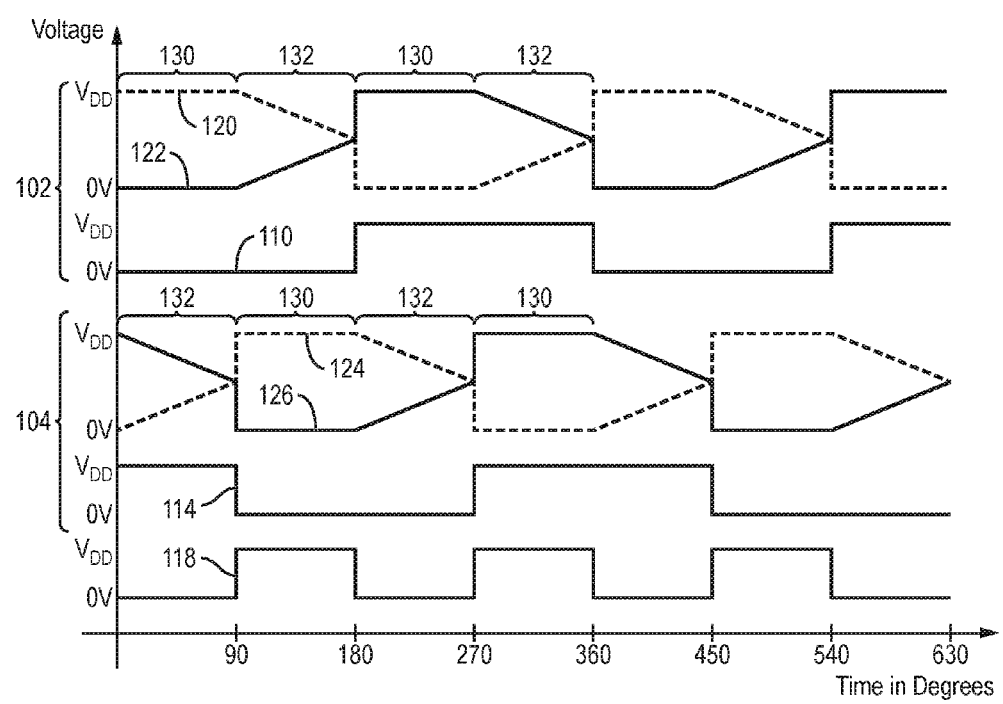

The operation of clock generation block 100 will be further explained using the timing diagrams illustrated in FIG. 2b. FIG. 2b illustrates the binary values or voltages of various signals on the vertical, or Y, axis. Time is illustrated on the horizontal, or X, axis. Time is expressed in units of degrees, where 360 degrees signifies the period of clock signals 110, 112, and 114. FIG. 2b first illustrates signals 120 and 122, which correspond to the voltages across two different capacitors within clock generation core 102. Signal 120 illustrates voltage on a first capacitor, and is illustrated with a dashed line. Signal 122 illustrates voltage on a second capacitor, and is illustrated using a solid line. The voltages on the capacitors vary between approximately a ground voltage level and approximately a $V_{DD}$ voltage level. In one embodiment, the ground voltage level is the voltage level of a logic zero in a complementary metal-oxide semiconductor (CMOS) circuit that uses clock signal 118, and $V_{DD}$ voltage level is the voltage level of a logic one for the CMOS circuit.

Clock signal 110 is illustrated below signals 120 and 122 in FIG. 2b. Clock signal 110 is generated by a comparator in clock generation core 102 that has signals 120 and 122 as inputs. The comparator in clock generation core 102 outputs clock signal 110 as a logical zero value if signal 122 is at a lower voltage level than signal 120. The comparator outputs clock signal 110 as a logical one value if signal 122 is at a higher voltage level than signal 120. The logic value of clock signal 110 switches from zero to one, or from one to zero, when signals 120 and 122 cross each other. Signals 120 and 122 are internal to clock generation core 102, and clock signal 110 is an output of clock generation core 102.

Signals 124 and 126 illustrate the voltages on two capacitors in clock generation core 104. Signals 124 and 126 are similar to signals 120 and 122 of clock generation core 102, but are 90 degrees behind. Clock signal 114 is generated by a comparator within clock generation core 104. The comparator in clock generation core 104 outputs clock signal 114 as a logical zero value if signal 126 is at a lower voltage level than signal 124. The comparator in clock generation core 104 outputs clock signal 114 as a logical one value if signal 126 is at a higher voltage level than signal 124. The logic value of clock signal 114 switches from zero to one, or from one to zero, when the voltage values of signals 124 and 126 cross each other.

Clock signal 118 is the output of XOR gate 116, which has clock signals 112 and 114 as inputs. Clock signal 118 is at $V_{DD}$, or a logic one value, when exactly one of clock signals 112 and 114 is a logic one value. If both clock signals 112 and 114 are the same value, either logic one or logic zero, clock signal 118 is output at ground level, or logic zero. Because clock signal 110 is inverted prior to being input to XOR gate 116 as clock signal 112, clock signal 118 is a logic one value if clock signals 110 and 114 have the same binary value, and a logic zero value if clock signals 110 and 114 have different binary values. Clock signal 118 operates at approximately twice the frequency of clock signals 110 and 114 because clock signals 110 and 114 are offset by approximately 90 degrees.

Each of clock generation cores 102 and 104 exists in either a latch state 130 or a ramp state 132. During latch state 130, the voltages of the capacitors in clock generation cores 102 and 104 stay approximately constant, with one capacitor at $V_{DD}$ and one capacitor at 0V. During ramp state 132, the two capacitor voltages of a clock generation core move closer to the opposite voltage value. A clock generation core 102 or 104 stays in ramp state 132 until the voltage values of the capacitors cross, at which time the clock generation cores shunt the capacitors to the new values, either 0V or $V_{DD}$. A clock generation core 102 or 104 stays in latch state 130 until the clock signal received as an input from the other clock generation core transitions, indicating that the other clock generation core 102 or 104 entered the latch state. As can be seen in FIG. 2b, clock generation core 102 is in latch state 130 while clock generation core 104 is in ramp state 132. Clock generation cores 102 and 104 are generally in opposite states other than during transition periods between the states.

When clock generation core 102 switches from ramp state 132 to latch state 130, e.g., at 180 degrees in FIG. 2b, the reversal of the relative voltages of signals 120 and 122 causes clock signal 110 to transition. The transition of clock signal 110 within clock generation core 102 results in signal 122 being internally connected to $V_{DD}$ and signal 120 being connected to ground. Clock signal 112 transitions accordingly, and is routed as an input to clock generation core 104. The transition of clock signal 110 triggers clock generation core 104 to transition from latch state 130 to ramp state 132. In ramp state 132, the voltages of signals 124 and 126 move closer to each other. Clock generation core 102 stays in latch state 130 until the voltage values of signals 124 and 126 cross in clock generation core 104 at approximately 270 degrees, triggering clock signal 114 to transition, which in turn causes clock generation core 102 to return to ramp state 132.

The signals illustrated in FIG. 2b will be further explained with reference to FIGS. 3a-3d, which illustrate a logical circuit diagram of clock generation block 100 through a full 360 degree cycle. The numbers identifying signals in FIG. 2b also refer to the circuit nodes that the signals are observed on in FIG. 3a-3d. Clock generation core 102 receives clock 114 as an input from clock generation core 104, and generates clock 110 as an output. Clock signal 110 is inverted by inverter 106 and received by clock generation core 104 as clock signal 112. Clock generation core 104 outputs clock signal 114 to clock generation core 102. Clock generation cores 102 and 104 also include inputs connected to $V_{DD}$ node 150 and ground node 154.

Current source 156 sinks electric current from $V_{DD}$ node 150 to clock generation cores 102 and 104. Current source 158 sinks current from clock generation cores 102 and 104 to ground node 154. In the embodiment illustrated in FIGS. 3a-3d, the same current sources 156 and 158 are used for both clock generation cores 102 and 104. In other embodiments, such as illustrated in FIG. 4, each clock generation core 102 and 104 includes separate current sources dedicated to an individual clock generation core. In some embodiments, current sources 156 and 158 are temperature compensated current sources which are shared in common with other circuits on a semiconductor device.

Capacitor 160 is coupled between ground node 154 and circuit node 120. Capacitor 162 is coupled between ground node 154 and circuit node 122. Capacitors 160 and 162 hold charge to have a voltage across the capacitors that varies between 0V and $V_{DD}$, as illustrated by signals 120 and 122 in FIG. 2b. The voltage across capacitor 160 is illustrated by signal 120 in FIG. 2b, and the voltage across capacitor 162 is illustrated by signal 122. The voltage on capacitor 160 at circuit node 120 and the voltage on capacitor 162 at circuit node 122 are controlled by switch arrays 170, 176, 180, and 186 manipulating how capacitors 160 and 162 are coupled to $V_{DD}$ node 150 and ground node 154.

Switch arrays 170 and 176 control coupling from circuit nodes 120 and 122 to $V_{DD}$ node 150 and ground node 154. Circuit nodes 120 and 122 are coupled to $V_{DD}$ node 150 or ground node 154 via switch arrays 170 and 176 when clock generation core 102 is in latch state 130. Coupling to $V_{DD}$ node 150 or ground node 154 via switch arrays 170 and 176 maintains the voltages at circuit nodes 120 and 122 at an approximately constant voltage, either $V_{DD}$ or 0V depending on the state of switch arrays 170 and 176.

Switch array 170 includes four single throw, or on-off, switches 170a, 170b, 170c, and 170d. The number of "throws" of a switch signifies the number of separate wiring path choices, other than open, that the switch can adopt. A single throw switch has one pair of contacts that can either be electrically open or closed. Switch 170a couples a first circuit node of switch 176a to ground node 154 when switch 170a is closed. Switch 170a disconnects switch 176a from ground node 154 when switch 170a is open. Switch 170b couples a second circuit node of switch 176a to $V_{DD}$ node 150 when switch 170b is closed. Switch 170b disconnects switch 176a from $V_{DD}$ node 150 when switch 170b is open. Switch 170c couples a first circuit node of switch 176b to ground node 154 when switch 170c is closed. Switch 170c disconnects switch 176b from ground node 154 when switch 170c is open. Switch 170d couples a second circuit node of switch 176b to $V_{DD}$ node 150 when switch 170d is closed. Switch 170d disconnects switch 176b from $V_{DD}$ node 150 when switch 170d is open. Switches 170a, 170b, 170c, and 170d in switch array 170 are each controlled by clock signal 114 input from clock generation core 104. At transitions of clock signal 114, switches in switch array 170 which were previously open are closed, and switches in array 170 which were previously closed are opened.

Switch array 176 includes two double throw, or change-over switches, 176a and 176b. A double throw switch connects a common terminal to one of two possible electrical paths. Each of the possible electrical paths that a switch can connect to is considered as one of the switch's "throws." Switch 176a connects circuit node 120 to either switch 170a or switch 170b. Switch 176b connects circuit node 122 to either switch 170c or 170d. Switches 176a and 176b in switch array 176 are controlled by clock signal 110, which is generated by clock generation core 102. Switch 176a couples circuit node 120 to switch 170a at transitions of clock signal 110 if switch 176a previously coupled circuit node 120 to switch 170b, or couples circuit node 120 to switch 170b if switch 170a was previously coupled. Switch 176b couples circuit node 122 to switch 170c at transitions of clock signal 110 if switch 176b previously coupled circuit node 122 to switch 170d, or couples circuit node 122 to switch 170d if switch 170c was previously coupled.

Switch arrays 180 and 186 control coupling from circuit nodes 120 and 122 to $V_{DD}$ node 150 via current source 156 and ground node 154 via current source 158. Circuit nodes 120 and 122 are coupled to current sources 156 and 158 via switch arrays 180 and 186 when clock generation core 102 is in ramp state 132. Coupling to current sources 156 and 158 via switch arrays 180 and 186 results in charge being added to or removed from capacitors 160 and 162 at a substantially steady rate. Therefore, the voltages at circuit nodes 120 and 122 increase or decrease at an approximately constant rate.

Switch array 180 includes switches 180a, 180b, 180c, and 180d. Switch array 180 operates similarly to switch array 170. Each switch 180a, 180b, 180c, and 180d toggles at transitions of clock signal 114. Switch array 186 includes switches 186a and 186b. Switch array 186 operates similarly to switch array 176, with each switch 186a and 186b toggling at transitions of clock signal 110.

Comparator 190 generates clock signal 110 by comparing the voltage of circuit node 120 to the voltage of circuit node 122. Clock signal 110 controls switch arrays 176 and 186, and is also routed as an output of clock generation core 102. Comparator 190 outputs a logic one value, or $V_{DD}$, if circuit node 122 is at a higher voltage than circuit node 120. Comparator 190 outputs a logic zero value, or ground, if circuit node 122 is at a lower voltage than circuit node 120.

Inverter 106 creates an inverted version of clock signal 110 as clock signal 112, which is routed as an input to clock generation core 104. Clock generation core 104 is similar to and includes similar constituent components as clock generation core 102. Capacitors 200 and 202 are similar to capacitors 160 and 162. Switch arrays 210 and 216 operate similarly to switch arrays 170 and 176 to selectively couple circuit nodes 124 and 126 to $V_{DD}$ node 150 and ground node 154. Switch array 210 includes switches 210a, 210b, 210c, and 210d that each toggle at transitions of clock signal 112. Switch array 216 includes switches 216a and 216b which each toggle at transitions of clock signal 114. Switch arrays 220 and 226 are similar to switch arrays 180 and 186, and selectively couple circuit nodes 124 and 126 to current sources 156 and 158. Switch array 220 includes switches 220a, 220b, 220c, and 220d that each toggle at transitions of clock signal 112. Switch array 226 includes switches 226a and 226b which each toggle at transitions of clock signal 114. Comparator 230 outputs a logic one, or $V_{DD}$, if circuit node 126 is at a greater voltage than circuit node 124. Comparator 230 outputs a logic zero, or ground, if circuit node 126 is at a lower voltage than circuit node 124.

Figure 3A:
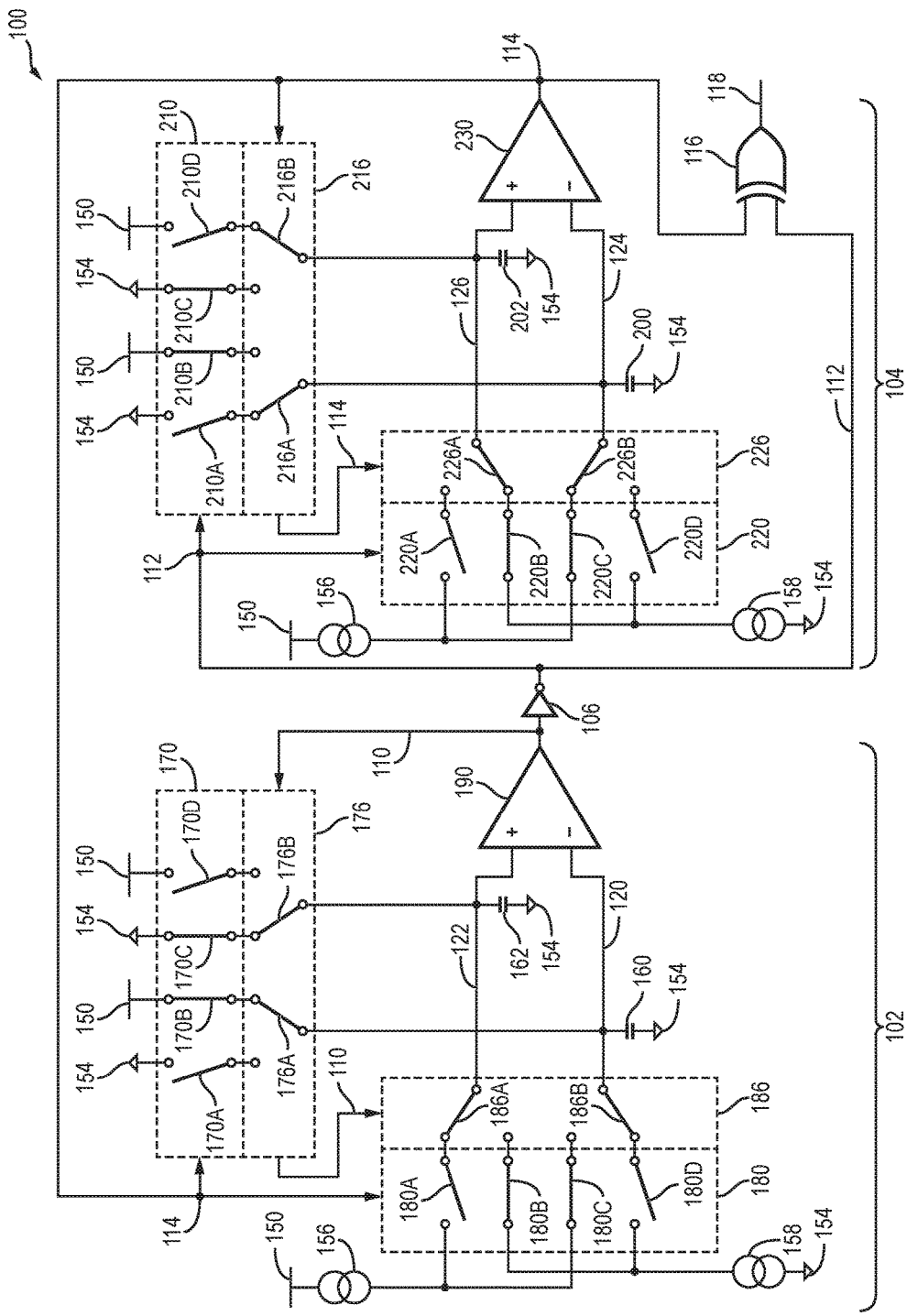
FIGS. 3a-3d illustrate details of clock generation cores of the clock generation block transitioning through clock generation states.
Figure 4:
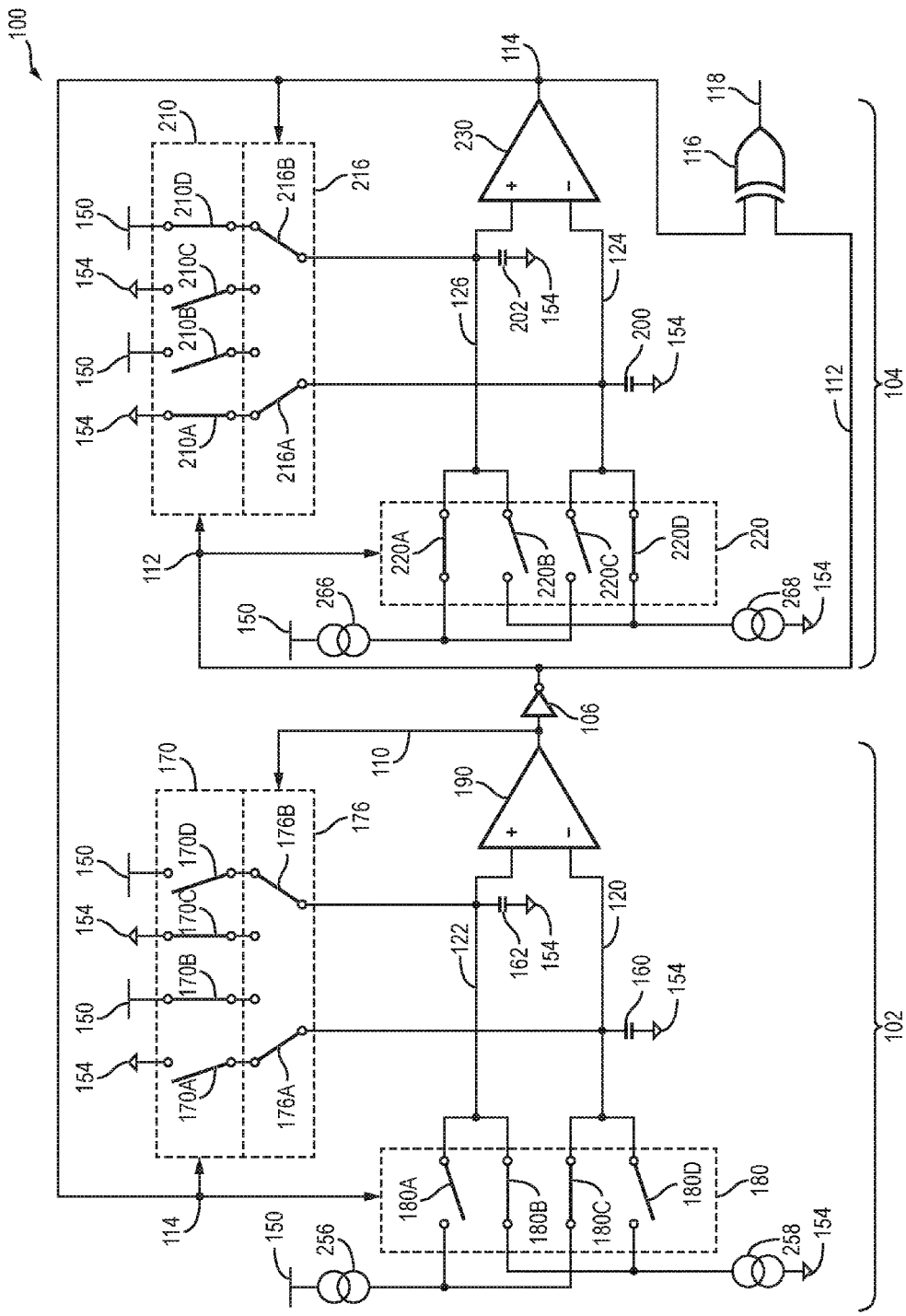
FIG. 4 illustrates an alternative clock generation block embodiment having separate current sources for each clock generation core.

FIG. 3a illustrates the state of switch arrays 170, 176, 180, 186, 210, 216, 220 and 226 between zero and 90 degrees on FIG. 2b. Clock generation core 102 is in latch state 130. Circuit node 120 is coupled to $V_{DD}$ node 150, and therefore the signal on circuit node 120 is held at approximately $V_{DD}$. Circuit node 120 is coupled to $V_{DD}$ node 150 via switch 170b, which is closed to allow current to flow, and switch 176a, which is switched to select switch 170b rather than switch 170a. Circuit node 120 is not coupled to a current source 156 or 158 because switch 186b is switched to select switch 180d, but switch 180d is open to limit current. Circuit node 122 is coupled to ground node 154, and therefore the signal on circuit node 122 is held at approximately ground voltage. Circuit node 122 is coupled to ground node 154 via switch 170c, which is closed to allow current to flow, and switch 176b, which is switched to select switch 170c rather than 170d. Circuit node 122 is not coupled to a current source 156 or 158 because switch 186a is switched to select switch 180a, but switch 180a is open to limit current.

Clock generation core 104 is in ramp state 132 between zero and 90 degrees in FIG. 2b. Circuit node 124 is coupled to current source 156, which sinks electrical charge from $V_{DD}$ node 150 to capacitor 200 at an approximately fixed rate, via switches 220c and 226b. The fixed rate of current flow raises the voltage at circuit node 124 approximately linearly with time. Circuit node 126 is coupled to current source 158, which sinks electrical charge from capacitor 202 to ground node 154, via switches 220b and 226a. The voltage on circuit node 124 begins at approximately ground level and steadily increases. The voltage on circuit node 126 begins at approximately $V_{DD}$ and steadily decreases. Voltages on circuit nodes 124 and 126 approach a central value between 0V and $V_{DD}$ as time passes from 0 degrees to 90 degrees.

Figure 3B:
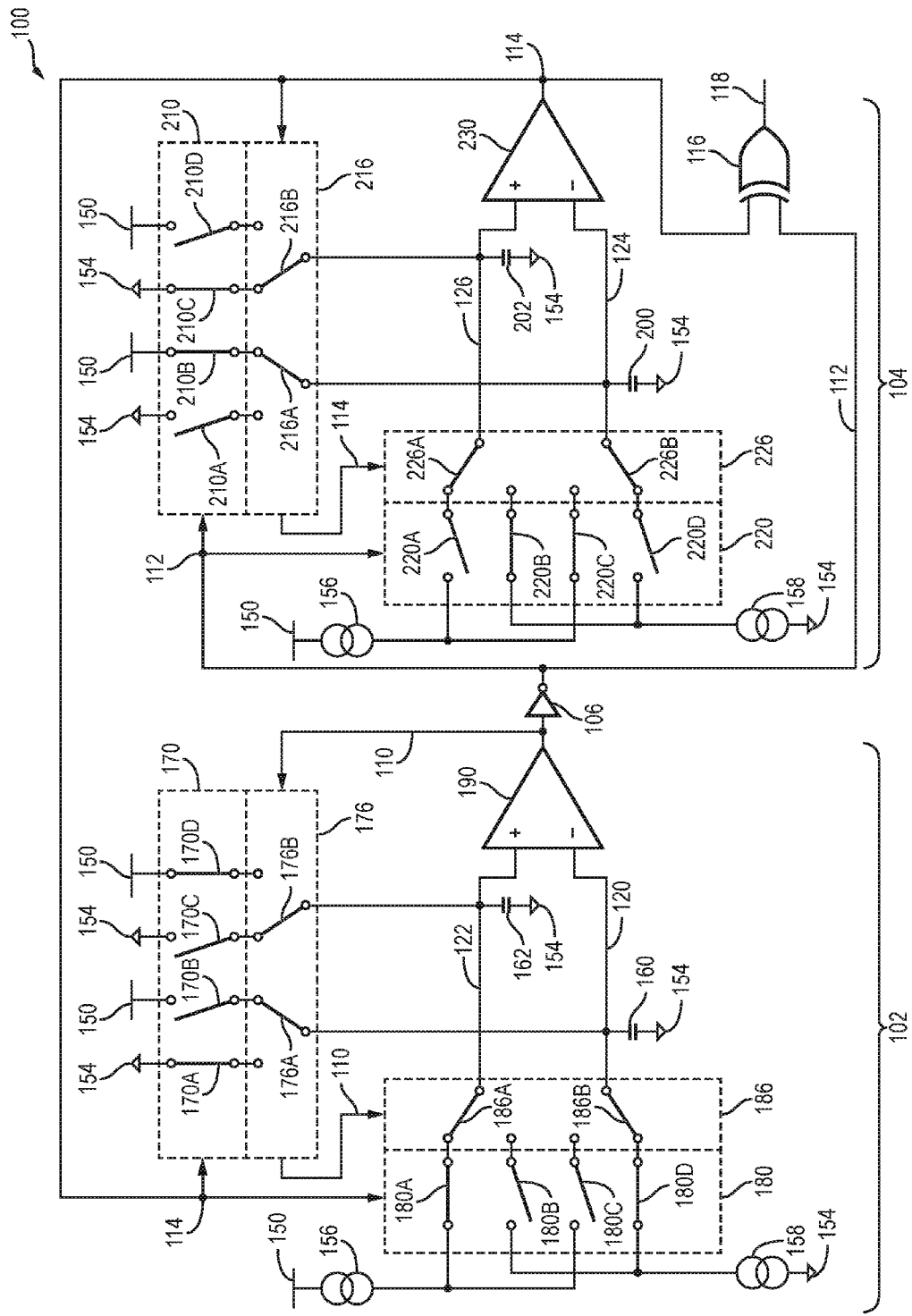

At time equal to approximately 90 degrees, the voltage levels of circuit nodes 124 and 126 cross, and circuit node 124 is at a higher voltage potential than circuit node 126. Comparator 230 recognizes that the voltage of circuit node 124 is higher than the voltage of circuit node 126, and clock signal 114 is transitioned from a logic one to a logic zero. Clock signal 114 is routed to switch arrays 170, 180, 216, and 226. Each of the switches in switch arrays 170, 180, 216, and 226 toggle in response to the transition of clock signal 114 to be configured as illustrated in FIG. 3b. The toggling of switch arrays 170, 180, 216, and 226 puts clock generation core 102 in ramp state 132 and clock generation core 104 in latch state 130 after time equal to 90 degrees, as illustrated in FIG. 2b.

FIG. 3b illustrates clock generation block 100 as configured after 90 degrees and before 180 degrees in FIG. 2b. Relative to FIG. 3a, each of the switches in switch arrays 170, 180, 216, and 226 has been toggled because of the transition of clock signal 114 at approximately 90 degrees. With switch 226b toggled, circuit node 124 is no longer coupled to current source 156 via switch 220c. Because switch 220d is open, circuit node 124 is not coupled to current source 158 either. However, switch 216a has toggled and shunted circuit node 124 to $V_{DD}$ node 150. Circuit node 124 is coupled to $V_{DD}$ node 150 via switch 216a and switch 210b, which is closed to allow current to flow. Similarly, switch 226a has disconnected circuit node 126 from current source 158, and switch 216b has connected circuit node 126 to ground node 154 via switch 210c. Clock generation core 104 is in latch state 130, and circuit nodes 124 and 126 are maintained at an approximately constant voltage potential.

At approximately the same time that clock signal 114 puts clock generation core 104 in latch state 130, the transition of clock signal 114 also toggles switch arrays 170 and 180 to put clock generation core 102 in ramp state 132. The toggling of switch array 170 opens switches 170b and 170c, disconnecting circuit node 120 from $V_{DD}$ node 150 and circuit node 122 from ground node 154. The toggling of switch array 180 closes switches 180a and 180d. Circuit node 120 is coupled to current source 158 via switches 186b and 180d. Current source 158 sinks electric charge from capacitor 160 to ground node 154 at an approximately steady rate, so the voltage at circuit node 120 is reduced approximately linearly between time 90 degrees and time 180 degrees. Circuit node 122 is coupled to current source 156 via switches 186a and 180a. Current source 156 sinks electric charge from $V_{DD}$ node 150 to capacitor 162 at an approximately steady rate, so the voltage at circuit node 122 is increased approximately linearly between time 90 degrees and time 180 degrees.

The voltages at circuit nodes 120 and 122 move toward each other while clock generation core 102 is in ramp state 132. At a time of approximately 180 degrees, the voltages of circuit nodes 120 and 122 cross and the relative positions of the voltages are switched. The voltage of circuit node 122 becomes higher than the voltage of circuit node 120, and comparator 190 switches clock signal 110 from a logic zero to a logic one. Clock signal 110 is routed to toggle switch arrays 176 and 186, as well as to inverter 106. Inverter 106 toggles clock signal 112 from a logic one to a logic zero in response to the transition of clock signal 110. Clock signal 112 is routed to toggle switch arrays 210 and 220, as well as to XOR gate 116.

Figure 3C:
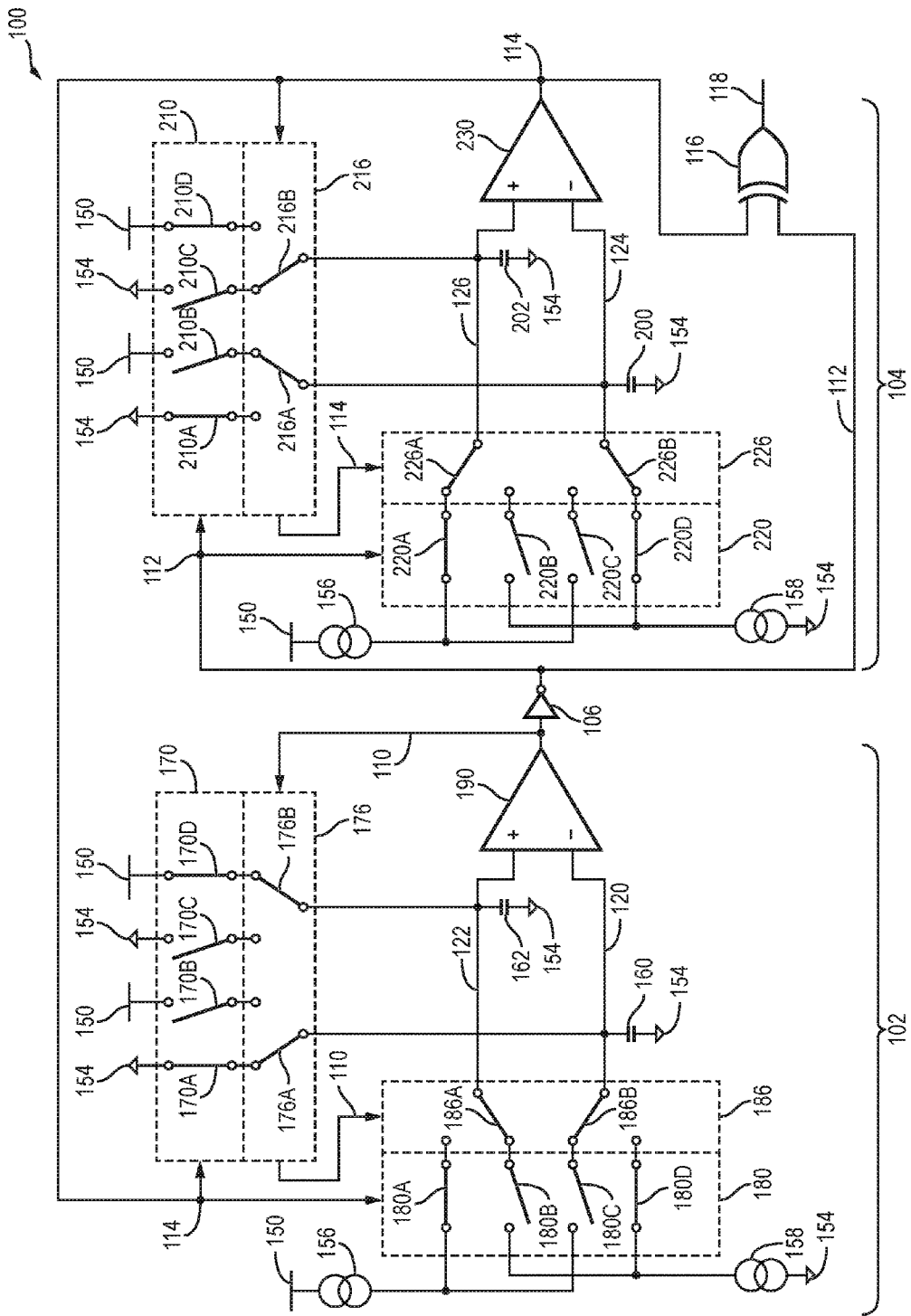

After comparator 190 causes a transition of clock signal 110, and switch arrays 176, 186, 210, and 220 are toggled, clock generation block 100 appears as in FIG. 3c. FIG. 3c illustrates clock generation block 100 between the times of 180 degrees and 270 degrees in FIG. 2b. Clock generation core 102 is in latch state 130, with circuit node 120 coupled to ground node 154 via switches 176a and 170a and circuit node 122 coupled to $V_{DD}$ node 150 via switches 176b and 170d. Switch array 186 has toggled to disconnect circuit nodes 120 and 122 from current sources 156 and 158 by connecting circuit nodes 120 and 122 to switches 180b and 180c, which are open.

Meanwhile, clock generation core 104 is in ramp state 132. Switch arrays 210 and 220 have toggled as a result of clock signal 112 transitioning. Switches 210b and 210c opening results in circuit node 124 being disconnected from $V_{DD}$ node 150 and circuit node 126 being disconnected from ground node 154. Switches 220a and 220d closing connects circuit node 124 to current source 158 via switch 226b, and connects circuit node 126 to current source 156 via switch 226a.

Current source 156 sinks current from $V_{DD}$ node 150 to capacitor 202 to increase the voltage at circuit node 126 over time. Current source 158 sinks current from capacitor 200 to ground node 154 to reduce the voltage at circuit node 124 over time. When the voltages of circuit nodes 124 and 126 switch polarity at approximately 270 degrees in FIG. 2b, the output of comparator 230, i.e., clock signal 114, transitions from a logic zero value to a logic one value. The transition of clock signal 114 toggles switch arrays 170, 180, 216, and 226.

Figure 3D:
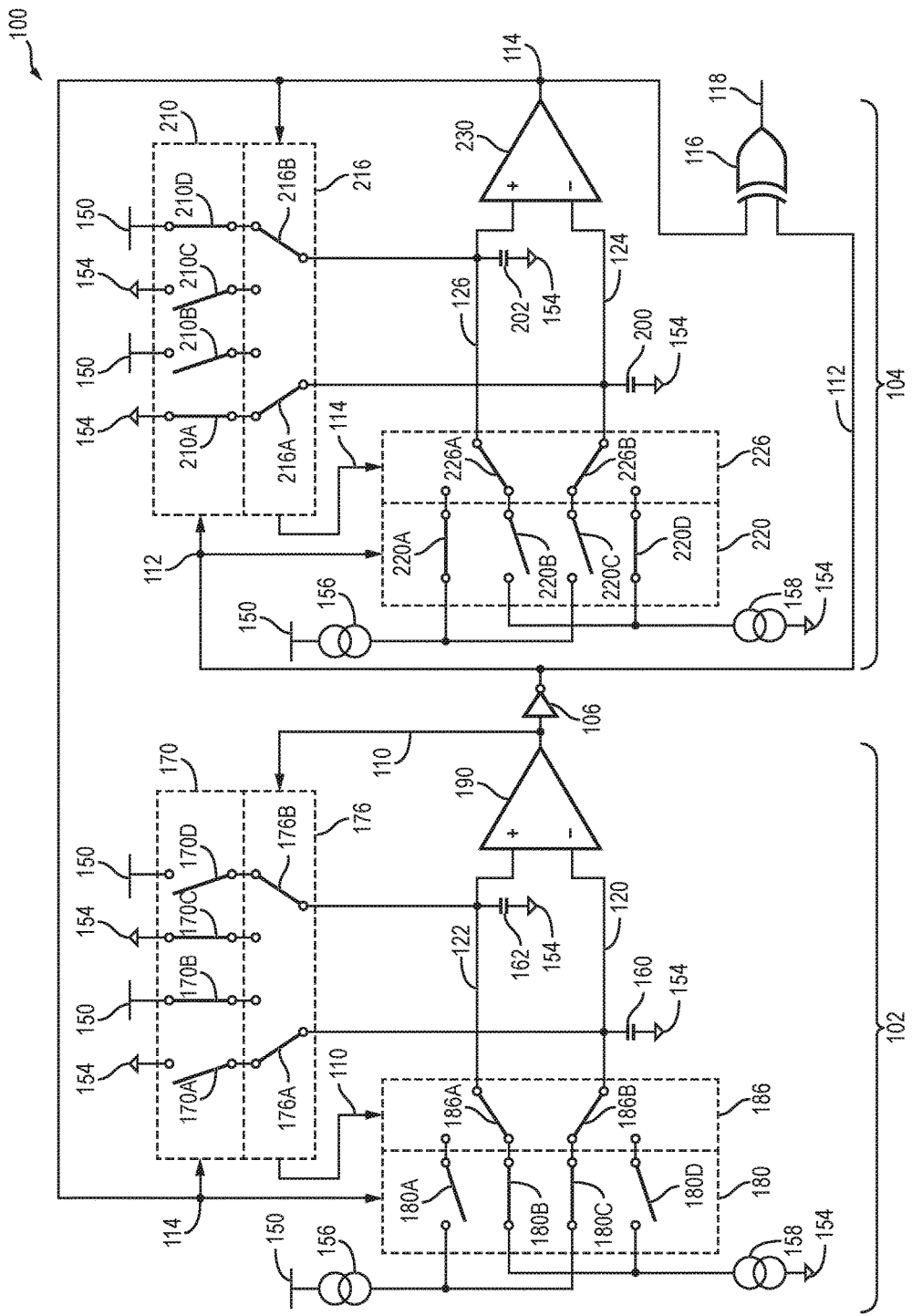

After 270 degrees in the timing diagram of FIG. 2b, and after clock signal 114 toggles switch arrays 170, 180, 216, and 226, clock generation block 100 is configured as illustrated in FIG. 3d. Clock generation core 102 is in ramp state 132, and clock generation core 104 is in latch state 130. Circuit node 124 is coupled to ground node 154 via switches 210a and 216a to maintain circuit node 124 at approximately ground voltage. Circuit node 126 is coupled to $V_{DD}$ node 150 via switches 210d and 216b to maintain circuit node 126 at approximately $V_{DD}$. Circuit node 120 is coupled to current source 156 via switches 186b and 180c to increase the voltage at circuit node 120 as time passes. Circuit node 122 is coupled to current source 158 via switches 186a and 180b to decrease the voltage at circuit node 122 over time.

After the voltages at circuit nodes 120 and 122 exchange polarities at approximately 360 degrees in FIG. 2b, comparator 190 toggles clock signals 110 and 112. Switch arrays 176, 186, 210, and 220 toggle, returning clock generation block 100 to the configuration shown in FIG. 3a. Clock generation core 102 returns to latch state 130, with circuit node 120 at $V_{DD}$ and circuit node 122 at ground. Clock generation core 104 returns to ramp state 132, with circuit node 124 ramping up from ground and circuit node 126 ramping down from $V_{DD}$. The cycle essentially restarts at 360 degrees in substantially the same situation as existed at 0 degrees.

The frequency of clock generation block 100 is determined by the amount of time that the capacitor voltages take to ramp from $V_{DD}$ and ground to a switched polarity. Increasing a capacitance value of capacitors 160, 162, 200, and 202 reduces the frequency of clock generation block 100 because the voltage change on the capacitors will be slower for the same current source amperage. Decreasing the capacitance of capacitors 160, 162, 200, and 202 increases the frequency of clock generation block 100 because the voltage change on the capacitors will be faster for the same current source value.

In addition to changing the capacitor values to modify the frequency of clock generation block 100, the amperage of current sources could be changed. Increasing the current during ramp state 132 increases the rate at which the capacitor voltages change for a constant capacitance value, increasing the frequency of clock generation block 100. Decreasing the current during ramp state 132 decreases the rate at which the capacitor voltages change for a constant capacitance value, decreasing the frequency of clock generation block 100.

In one embodiment, a frequency of clock signal 118 is between 5 megahertz (MHz) and 40 MHz. In other embodiments, clock generation block 100 is a 20 MHz oscillator. In some embodiments, clock generation block 100 uses variable capacitors for capacitors 160, 162, 200, and 202, variable current sources 156 and 158, or both variable capacitors and variable current sources, to allow for configuration of an output frequency of clock generation block 100.

Clock generation block 100 creates a clock signal 118 usable by electronic device 50, as well as other electronic and semiconductor devices. Electronic device 50 also uses clock signals 110, 112, or 114 in other embodiments to have a clock running at half the frequency of clock signal 118. In some embodiments, a clock signal 110, 112, or 114 is used without the use of XOR gate 116 to generate clock signal 118 at double the frequency. Clock generation block 100 offers low current consumption, increasing battery life of portable devices which use the clock generation block. Temperature compensated voltage and current sources can be used where those already exist on a device that clock generation block 100 is integrated into, saving space. Each clock generation core 102 and 104 of clock generation block 100 uses two contradictory voltage ramps, with a state determined by a differential voltage. Fast decision cells are used for comparators 190 and 230 as needed to allow for a higher output frequency of clock generation block 100.

Clock generation core 102 and clock generation core 104 in FIGS. 3a-3d are connected to common current sources 156 and 158. In other embodiments, clock generation core 102 and clock generation core 104 each include dedicated current sources that are only used for the ramp state of that particular clock generation core.

FIG. 4 illustrates an embodiment with separate current sources for clock generation core 102 and clock generation core 104. Clock generation core 102 includes current source 256 to sink current from $V_{DD}$ node 150 to clock generation core 102. Clock generation core 102 includes current source 258 to sink current from clock generation core 102 to ground node 154. Clock generation core 104 includes current source 266 to sink current from $V_{DD}$ node 150 to clock generation core 104. Clock generation core 104 includes current source 268 to sink current from clock generation core 104 to ground node 154.

Having separate current sources between clock generation core 102 and clock generation core 104 makes switch arrays 186 and 226 optional. FIG. 4 is illustrated without switch arrays 186 and 226. Switch array 186 in FIGS. 3a-3d operates to disconnect current sources 156 and 158 from clock generation core 102 when clock generation core 102 is in latch state 130 and clock generation core 104 is in ramp state 132. Switch array 226 operates to disconnect current sources 156 and 158 from clock generation core 104 when clock generation core 104 is in latch state 130 and clock generation core 102 is in ramp state 132.

In latch state 130, capacitors 160, 162, 200, and 202 are coupled to $V_{DD}$ node 150 or ground node 154. Without switch arrays 186 and 226 to disconnect current sources 156 and 158 from capacitors 160, 162, 200, and 202 in latch state 130, the outputs of the current sources are coupled to $V_{DD}$ node 150 and ground node 154. Usage of current sources 156 and 158 is disrupted for other circuits, including the clock generation core 102 or 104 that is in ramp state 132. In FIG. 4, clock generation core 102 includes dedicated current sources 256 and 258. Clock generation core 104 includes dedicated current sources 266 and 268. Current sources 256, 258, 266, and 268 can have outputs coupled to $V_{DD}$ node 150 or ground node 154 without disrupting other circuits and modules on the same device.

Separated current sources offers the benefit of reducing four double throw switches from the layout of clock generation block 100. On the other hand, coupling the current sources to $V_{DD}$ node 150 or ground node 154 causes the current sources to go into saturation during latch state 130. The current sources being in saturation slows down the response of the current sources when clock generation core 102 or 104 transitions to ramp state 132.

Figure 5:
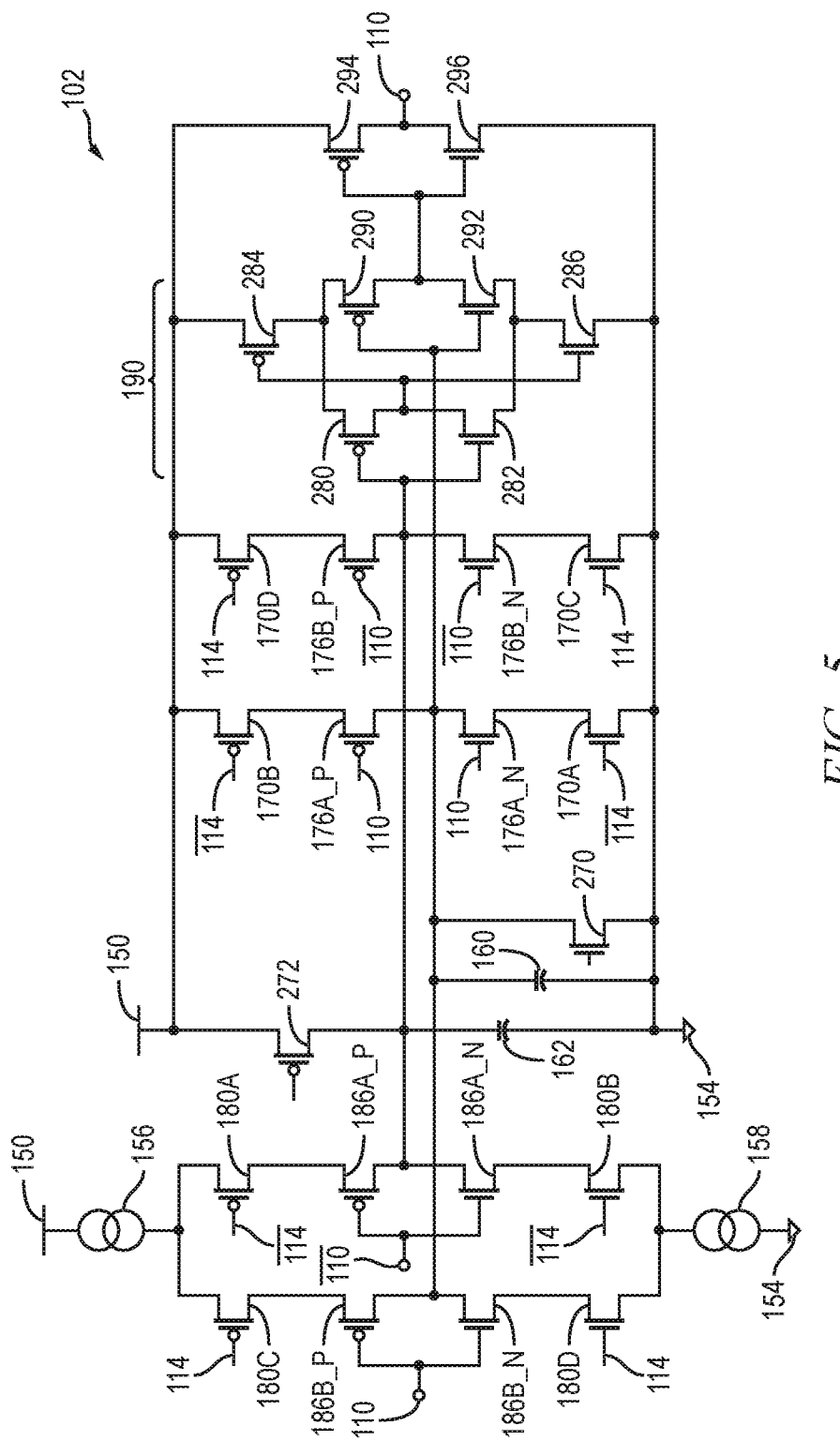
FIG. 5 illustrates a clock generation core implemented in CMOS logic.

FIG. 5 illustrates clock generation core 102 implemented in CMOS logic. CMOS refers to a circuit formed from metal-oxide semiconductor field-effect transistors (MOSFETs), with complementary pairs of p-type and n-type MOSFETs. Each of the switches illustrated in FIGS. 3a-3d are implemented using one or more MOSFET devices as illustrated. MOSFETs are used as switches. The composition of a PMOS transistor creates low resistance between its source and drain contacts when a low gate voltage is applied and high resistance when a high gate voltage is applied. On the other hand, the composition of an NMOS transistor creates high resistance between source and drain when a low gate voltage is applied and low resistance when a high gate voltage is applied. An n-channel MOSFET is illustrated, e.g., by switch 180d in FIG. 5. A p-channel MOSFET is illustrated, e.g., by switch 180c in FIG. 5. A circle on a gate connection of a MOSFET indicates that the MOSFET is a p-channel MOSFET rather than an n-channel MOSFET.

Switch arrays 180 and 186 control the connections of current sources 156 and 158 to capacitors 160 and 162. Switches 180a, 180b, 180c, and 180d are each implemented using a single MOSFET to turn a connection on or off, which matches what is shown in FIGS. 3a-3d. The MOSFET of switch 180a is connected in series between current source 156 and switch 186a. The drain terminal of MOSFET 180a is connected to current source 156. The source terminal of MOSFET 180a is connected to MOSFET 186a_p. The gate terminal of MOSFET 180a is connected to the inverse of clock signal 114. Just as is illustrated in FIGS. 3a-3d with regard switch 180a, MOSFET 180a in FIG. 5 turns a connection between switch 186a and current source 156 on or off based on the state of clock signal 114.

Similarly, the MOSFET of switch 180b is coupled between current source 158 and switch 186a, the MOSFET of switch 180c is coupled between current source 156 and switch 186b, and switch 180d is coupled between current source 158 and switch 186b. Each switch in switch array 180 is capable of disconnecting one of the current sources 156 and 158 from one of the capacitors 160 or 162 based on the state of clock signal 114 from clock generation core 104.

A line over the reference number 114 in FIG. 5 indicates that clock signal 114 is logically inverted, by an inverter, prior to being coupled to the gate of a particular MOSFET. A line over the reference number 110 in FIG. 5 indicates that clock signal 110 is logically inverted, by an inverter, prior to being coupled to the gate of a particular MOSFET. Clock generation core 102 uses clock signal 112, which is an inverted version of clock signal 110, to control MOSFETs 186a_p, 186a_n, 176b_p, and 176b_n in some embodiments. Other embodiments include additional inverters for creating an inverted version of clock signal 110 specifically for use internal to clock generation core 102.

Switches 186a and 186b are each implemented using two complementary MOSFETs. Switch 186a is implemented using p-channel MOSFET 186a_p and n-channel MOSFET 186a_n. Switch 186b is implemented using p-channel MOSFET 186b_p and re-channel MOSFET 186b_n. MOSFET 186a_p controls coupling between switch 180a and capacitor 162. MOSFET 186a_n controls coupling between switch 180b and capacitor 162. Essentially, each of MOSFETs 186a_p and 186a_n is one of the "throws" of switch 186a in FIGS. 3a-3d. The gate terminals of MOSFETs 186a_p and 186a_n are connected to a common input, the inverse of clock signal 110, and so are wired to generally remain in opposite states. Switch 186a_p is open when switch 186a_n is closed, and switch 186a_p is closed when switch 186a_n is open. MOSFETs 186a_n and 186a_p, in combination, connect capacitor 162 either to switch 180a or switch 180b depending on the value of clock signal 110. MOSFETs 186b_n and 186b_p operate as the "throws" of switch 186b in a similar manner.

MOSFETs 170a, 170b, 170c, 170d, 176a_p, 176a_n, 176b_p, and 176b_n operate similarly to MOSFETs 180a, 180b, 180c, 180d, 186a_p, 186a_n, 186b_p, and 186b_n. However, MOSFETs of switch arrays 170 and 176 control coupling from $V_{DD}$ node 150 and ground node 154 to capacitors 160 and 162, while the MOSFETs of switch arrays 180 and 186 control coupling from current sources 156 and 158. MOSFETs 170a, 170b, 170c, and 170d in FIG. 5 implement switches 170a, 170b, 170c, and 170d in FIGS. 3a-3d using one MOSFET per switch. MOSFETs 170a_p and 170a_n in FIG. 5 correspond to the two throws of switch 170a in FIGS. 3a-3d. MOSFETs 170b_p and 170b_n correspond to the two throws of switches 170b.

The CMOS implementation of clock generation core 102 adds two reset MOSFETs 270 and 272. MOSFETs 270 and 272 are controlled by a reset or enable signal input to clock generation core 102. MOSFET 270 short circuits capacitor 160 to ground node 154, and MOSFET 272 short circuits capacitor 162 to $V_{DD}$ node 150, when the MOSFETs are enabled. Including MOSFETs 270 and 272 allows the voltages of capacitors 160 and 162 to be initialized to known valid values.

Comparator 190 is implemented by MOSFETs 280, 282, 284, 286, 290, and 292. Any appropriate comparator embodiment may be utilized with clock generation cores 102 and 104. In some embodiments, standard operational amplifier topologies are used for comparators 190 and 230. In other embodiments, other known comparator topologies are used. FIG. 5 illustrates one exemplary, and non-limiting, embodiment of comparator 190. The implementation of comparator 190 shown in FIG. 5 is relatively high-speed and particularly useful for high-frequency implementations of clock generation block 100. An inverter is formed using MOSFETs 294 and 296, and is used as a buffer at the output stage of clock generation core 102 to generate clock signal 110. Clock generation core 104 includes a similar CMOS layout and functions similarly to clock generation core 102 in FIG. 5.

While one or more embodiments have been illustrated in detail, the skilled artisan will appreciate that modifications and adaptations to those embodiments may be made without departing from the scope of the present disclosure.

What is claimed:
1. A clock generator, comprising:
   a first switching core including,
   (a) a first capacitor,
   (b) a current source,
   (c) a voltage node,

(d) a first switching circuit coupled between a terminal of the first capacitor and the current source, and (e) a second switching circuit coupled between the terminal of the first capacitor and the voltage node;

a second switching core, wherein an output of the first switching core is coupled to an input of the second switching core and an output of the second switching core is coupled to an input of the first switching core; and an inverter coupled between the output of the first switching core and the input of the second switching core.

2. The clock generator of claim 1, wherein the first switching core further includes:

a second capacitor;

a third switching circuit coupled between a terminal of the second capacitor and the current source; and a fourth switching circuit coupled between the terminal of the second capacitor and the voltage node.

3. The clock generator of claim 2, further including a comparator comprising a first input coupled to the terminal of the first capacitor, a second input coupled to the terminal of the second capacitor, and an output coupled to a control terminal of the first switching circuit and a control terminal of the second switching circuit.

4. A clock generator, comprising:

a first switching core including, (a) a first capacitor, (b) a current source, (c) a voltage node, (d) a first switching circuit coupled between a terminal of the first capacitor and the current source, and (e) a second switching circuit coupled between the terminal of the first capacitor and the voltage node;

a second switching core, wherein an output of the first switching core is coupled to an input of the second switching core and an output of the second switching core is coupled to an input of the first switching core; and an XOR gate having a first input coupled to the output of the first switching core, a second input coupled to the output of the second switching core, and an output providing a clock signal.

5. The clock generator of claim 4, wherein the first switching circuit and second switching circuit include metal-oxide semiconductor field-effect transistors (MOSFETs).

6. A clock generator, comprising:

a first capacitor;

a current source;

a first switch coupled between the first capacitor and the current source; and a first comparator including a first input of the first comparator coupled to the first capacitor and an output of the first comparator coupled to a control terminal of the first switch; and an XOR gate coupled to the output of the first comparator.

7. The clock generator of claim 6, further including:

a voltage node; and a second switch coupled between the first capacitor and the voltage node.

8. The clock generator of claim 6, further including:

a second capacitor; and a second switch coupled between the current source and the second capacitor.

9. The clock generator of claim 8, wherein the capacitor is coupled to a second input of the first comparator.

10. The clock generator of claim 8, wherein the output of the first comparator is coupled to a control terminal of the second switch.

11. The clock generator of claim 10, further including:

a third switch coupled between the first capacitor and current source in series with the first switch; and a second comparator including an input of the second comparator coupled to the second capacitor and an output of the second comparator coupled to a control terminal of the third switch.

12. A method of generating a clock signal, comprising:

providing a first switching core;

providing a second switching core, wherein an output of the first switching core is coupled to an input of the second switching core and an output of the second switching core is coupled to an input of the first switching core; and providing an exclusive-OR gate having a first input coupled to the output of the first switching core, a second input coupled to an output of the second switching core, and an output providing the clock signal by controlling the first switching core and the second switching core.

13. The method of claim 12, wherein controlling the first switching core includes:

setting a first state of a first switching circuit to route a current to a first capacitor during a first time period; and setting a first state of a second switching circuit to connect the first capacitor to a voltage node during a second time period.

14. The method of claim 13, wherein controlling the first switching core further includes:

setting a second state of the first switching circuit to route the current to a second capacitor during a third time period; and setting a second state of the second switching circuit to connect the second capacitor to the voltage node during a fourth time period.

15. The method of claim 14, further including comparing a voltage on the first capacitor and a voltage on the second capacitor.

16. The method of claim 15, wherein the comparing the voltage on the first capacitor and the voltage on the second capacitor controls the first switching circuit.

17. The method of claim 14, further including routing the current to the first capacitor while the second capacitor is connected to the voltage node.

18. The method of claim 12, further including inverting the output of the first switching core to the input of the second switching core.

* * * * *